United States Patent
Yamamoto et al.

(10) Patent No.: US 10,976,346 B2
(45) Date of Patent: Apr. 13, 2021

(54) SOCKET (71) Applicant: YOKOWO CO., LTD., Tokyo (JP)

(72) Inventors: Tsugio Yamamoto, Tomioka (JP); Kenichi Sato, Tomioka (JP); Takayoshi Okuno, Tomioka (JP)

(73) Assignee: YOKOWO CO., LTD., Tokyo (JP)

( * ) Notice: Subject to any disclaimer, the term of this patent is extended or adjusted under 35 U.S.C. 154(b) by 298 days.

(21) Appl. No.: 15/441,366

(22) Filed: Feb. 24, 2017

(65) Prior Publication Data

US 2017/0248630 A1 Aug. 31, 2017

(30) Foreign Application Priority Data

Feb. 29, 2016 (JP) .................................. 2016-038208

(51) Int. Cl.
*G01R 1/04* (2006.01)
*G01R 1/067* (2006.01)
*G01R 31/28* (2006.01)

(52) U.S. Cl.
CPC .......... *G01R 1/0433* (2013.01); *G01R 1/0441* (2013.01); *G01R 1/06722* (2013.01); *G01R 31/2886* (2013.01)

(58) Field of Classification Search
None
See application file for complete search history.

(56) References Cited

U.S. PATENT DOCUMENTS

| | | | |
|---|---|---|---|
| 6,150,616 A | 11/2000 | Kazama | |
| 6,323,667 B1 | 11/2001 | Kazama | |
| 6,396,293 B1 | 5/2002 | Vinther et al. | |
| 6,462,567 B1 | 10/2002 | Vinther et al. | |
| 6,512,389 B1 * | 1/2003 | Kocher | G01R 1/07371 324/750.26 |
| 6,953,348 B2 * | 10/2005 | Yanagisawa | G01R 1/0441 333/260 |
| 6,992,496 B2 * | 1/2006 | Winter | G01R 1/0441 324/750.25 |
| 2004/0212381 A1 * | 10/2004 | Yoshida | G01R 1/06772 324/755.02 |

(Continued)

FOREIGN PATENT DOCUMENTS

| | | |
|---|---|---|
| JP | S-48-075150 U | 12/1971 |
| JP | 07-057808 A | 3/1995 |

(Continued)

OTHER PUBLICATIONS

English Translation of JP 07-057808A (Year: 1995).*

(Continued)

*Primary Examiner* — Paresh Patel (74) *Attorney, Agent, or Firm* — Morgan, Lewis & Bockius LLP (57) ABSTRACT

A socket includes: a contact probe; and an insulating support body supporting the contact probe. The contact probe includes: a first plunger to be connected with an object to be inspected; a second plunger to be connected with an inspecting board; and a spring configured to urge the first plunger and the second plunger in a direction apart from each other. In a state where a tip end of the first plunger is released, a projecting amount of the second plunger from the insulating support body is zero with a natural length of the spring.

13 Claims, 6 Drawing Sheets

(56) References Cited

U.S. PATENT DOCUMENTS

| | | | |
|---|---|---|---|
| 2005/0280433 A1* | 12/2005 | Nelson | G01R 1/06722 324/755.05 |
| 2006/0089013 A1* | 4/2006 | Batara | G01R 1/0433 439/68 |
| 2007/0018666 A1* | 1/2007 | Barabi | G01R 1/06722 324/754.14 |
| 2013/0099814 A1* | 4/2013 | Kazama | H01L 24/72 324/755.05 |
| 2013/0203298 A1* | 8/2013 | Zhou | H01R 13/2435 439/700 |

FOREIGN PATENT DOCUMENTS

| | | | |
|---|---|---|---|
| JP | 07057808 A | * | 3/1995 |
| JP | 10-214649 A | | 8/1998 |
| JP | H10-239349 A | | 9/1998 |
| JP | 2000-241447 A | | 9/2000 |
| JP | 2003-178848 A | | 6/2003 |
| JP | 2006-164623 A | | 6/2006 |
| JP | 2006269366 A | * | 10/2006 |
| JP | 2008-175700 A | | 7/2008 |
| JP | 2008157800 A | | 7/2008 |
| JP | 2014-192118 A | | 10/2014 |
| JP | 2014192118 A | * | 10/2014 |
| JP | 2015-215223 A | | 12/2015 |
| JP | 2015-215327 A | | 12/2015 |
| TW | 528871 B | | 4/2003 |

OTHER PUBLICATIONS

Japanese Patent Office Action in corresponding Japanese Patent No. 2016-038208 dated Jun. 13, 2018 along with English translation of same.

Chinese Office Action dated Sep. 29, 2019 in corresponding Chinese Patent Application No. 201710111765.6 along with an English translation of same.

Office Action dated Feb. 12, 2020 issued in Japanese Patent Application No. 2019-087287 with machine translation.

Office Action dated Jun. 24 2020, issued in corresponding Japanese Application No. 2016-038208.

Office Action dated Aug. 4, 2020, issued in corresponding Japanese Application No. 2019-087287.

* cited by examiner

SOCKET

CROSS-REFERENCE TO RELATED APPLICATION(S)

This application is based upon and claims the benefit of priority from prior Japanese patent application No. 2016-038208, filed on Feb. 29, 2016, the entire contents of which are incorporated herein by reference.

BACKGROUND

The present invention relates to a socket in which contact probes are supported by an insulating support body.

On occasion of inspecting an object to be inspected such as a semiconductor integrated circuit, a socket in which contact probes are supported by an insulating support body is used, for the purpose of connecting the object to be inspected with an inspecting board of a measuring instrument. Each of the contact probes has a first plunger adapted to be connected with the object to be inspected, a second plunger adapted to be connected with the inspecting board, and a spring for urging the first and second plungers so as to be separated from each other. In the related art, for example, disclosed in JP-A-2015-215223, the socket has been designed so that when the socket is set on the inspecting board, the second plunger is pressed with an electrode on the inspecting board thereby to retreat, while compressing the spring. For this purpose, in a state where a tip end of the first plunger is released (in a state where no external force is applied to the tip end of the first plunger), a contact force of a certain value or more is generated between the second plunger and the electrode on the inspecting board, by an urging force of the spring. This contact force (load) is called as a preload, and it has been considered that the preload attributes to improvement of contact stability, and reduction and stabilization of contact resistance.

The preload will be a cause for a warp of the insulating support body for supporting the contact probes. It is required to suppress the warp of the insulating support body so as to be equal to or less than a predetermined value, from a viewpoint of design. On the other hand, in a recent semiconductor inspecting field, in addition to a conventional request for cost reduction, it is strongly requested to increase the number of pins for multifunction, and to realize downsizing for dealing with high frequency. An increase of the number of the pins incurs an increase of the preload of the socket in its entirety, and enlarges the warp of the insulating support body. Moreover, for realizing the downsizing, the insulating support body must have a smaller wall thickness, which also enlarges the warp of the insulating support body. Further, from a view point of the cost reduction, it is actually impossible to use the material having high rigidity in which a warp is unlikely to occur, as the material for the insulating support body. For these reasons, in the conventional concept of design, it has been impossible to comply with the requests for increasing the number of the pins, realizing the downsizing, and achieving the cost reduction, due to the warp of the insulating support body.

SUMMARY

The present invention has been made in view of the above described circumstances. It is an object of the present invention to provide a socket which is advantageous in increasing the number of pins and in realizing downsizing, and also capable of achieving cost reduction.

According to a first aspect of the present invention, there is provided a socket including: a contact probe; and an insulating support body supporting the contact probe, wherein the contact probe has: a first plunger to be connected with an object to be inspected; a second plunger to be connected with an inspecting board; and a spring configured to urge the first plunger and the second plunger in a direction apart from each other, and, in a state where a tip end of the first plunger is released, a projecting amount of the second plunger from the insulating support body can be made zero with a natural length of the spring.

The spring may be loaded in the contact probe, in a state where movements of the first plunger and the second plunger in the direction apart from each other are limited, without depending on the insulating support body.

The contact probe may have an electrically conductive tube which is integrally provided with the first plunger, the second plunger may be provided inside the electrically conductive tube, in a state prevented from dropping from the electrically conductive tube, and the spring may be provided inside the electrically conductive tube.

One of the first plunger and the second plunger may have a rod-shaped part which passes through the spring, and the other of the first plunger and the second plunger may be provided with a lock part which is engaged with the rod-shaped part.

In a state where the tip end of the first plunger is released, and a projecting amount of the second plunger from the insulating support body is zero, an urging force of the spring may be equal to or less than 10 gf.

In a state where the tip end of the first plunger is released, and a projecting amount of the second plunger from the insulating support body is zero, an urging force of the spring may be equal to or less than one third of an urging force of the spring at a time of inspection.

According to a second aspect of the present invention, there is provided a socket including: a contact probe; and an insulating support body supporting the contact probe, wherein the contact probe has: a first plunger to be connected with an object to be inspected; and a spring to be connected with an inspecting board and configured to urge the first plunger in a direction of projecting a tip end of the first plunger from the insulating support body, and, in a state where the tip end of the first plunger is released, a projecting amount of the spring from the insulating support body can be made zero with a natural length of the spring.

In a state where the tip end of the first plunger is released, and the projecting amount of the spring from the insulating support body is zero, an urging force of the spring may be equal to or less than 10 gf.

In the state where the tip end of the first plunger is released, and the projecting amount of the spring from the insulating support body is zero, an urging force of the spring may be equal to or less than one third of an urging force of the spring at a time of inspection.

Any arbitrary combination of the above described constituent elements, and descriptions of the present invention which are converted between methods and systems are also deemed effective as aspects of the present invention.

DETAILED DESCRIPTION OF EXEMPLARY EMBODIMENTS

Hereinafter, preferred embodiments of the present invention will be described in detail with reference to the drawings. Identical or equivalent components, members, and the like shown in the respective drawings are denoted with the same reference numerals, and duplicated descriptions are appropriately omitted. The embodiments do not limit the invention, but only exemplify the invention and all the features described in the embodiments, and their combinations are not necessarily essential in the invention.

Embodiment 1

Figure 1A:
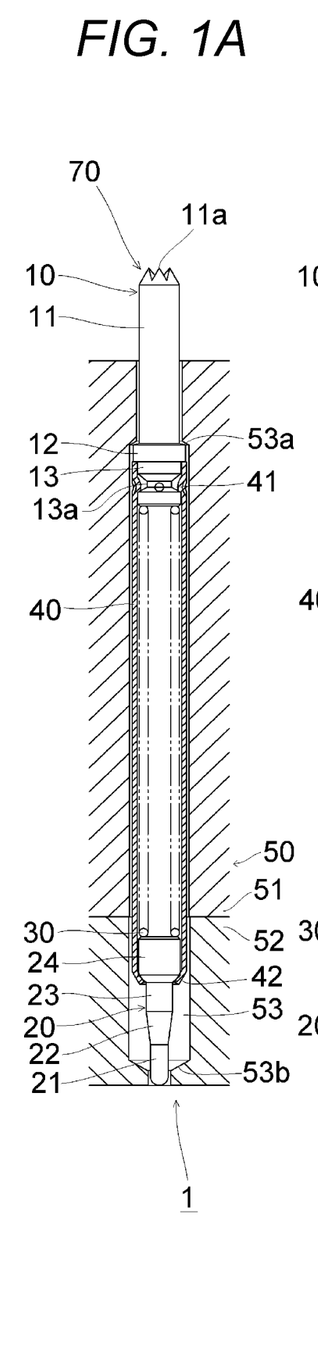
FIG. 1A is a sectional view of a socket 1 in Embodiment 1 according to the present invention, in a state where both tip ends of a first plunger 10 and a second plunger 20 are released.

As shown in FIG. 1A, a socket 1 in this embodiment includes a contact probe 70, and an insulating support body 50 for supporting the contact probe 70. Although FIG. 1A shows the only one contact probe 70, the socket 1 may be of a multi-pin type in which a number of the contact probes 70 are supported by the common insulating support body 50. The insulating support body 50 is formed of, for example, resin, and provided with a through hole 53 for containing the contact probe 70. The insulating support body 50 includes a first insulating support body 51 and a second insulating support body 52 which are combined with each other, and secured with a screw or the like.

The contact probe 70 has a first plunger 10, a second plunger 20, a spring 30, and an electrically conductive tube 40. Both the first plunger 10 and the second plunger 20 are formed of metallic material such as copper or copper alloy. The first plunger 10 is adapted to be connected with an object 9 to be inspected such as a semiconductor integrated circuit, and the second plunger 20 is adapted to be connected with an inspecting board 8 of a measuring instrument. The spring 30 is a coil spring formed of general material such as a piano wire, a stainless steel wire, and urges the first plunger 10 and the second plunger 20 in a direction apart from each other.

Figure 1B:
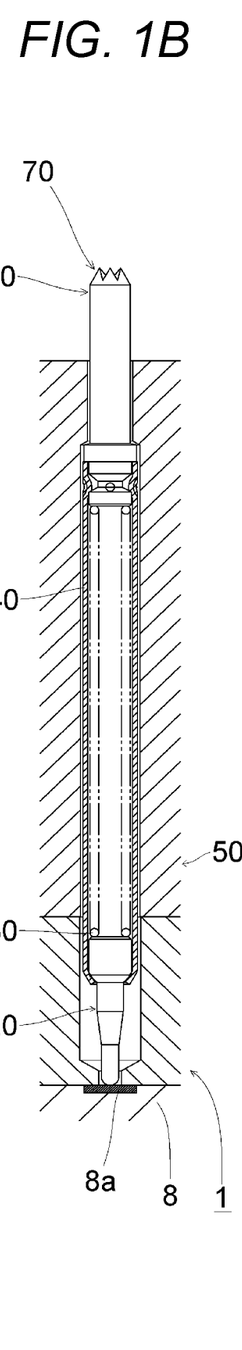
FIG. 1B is a sectional view of the socket 1 in a state where the socket 1 is mounted on an inspecting board 8, and the tip end of the first plunger 10 is released.
Figure 1C:
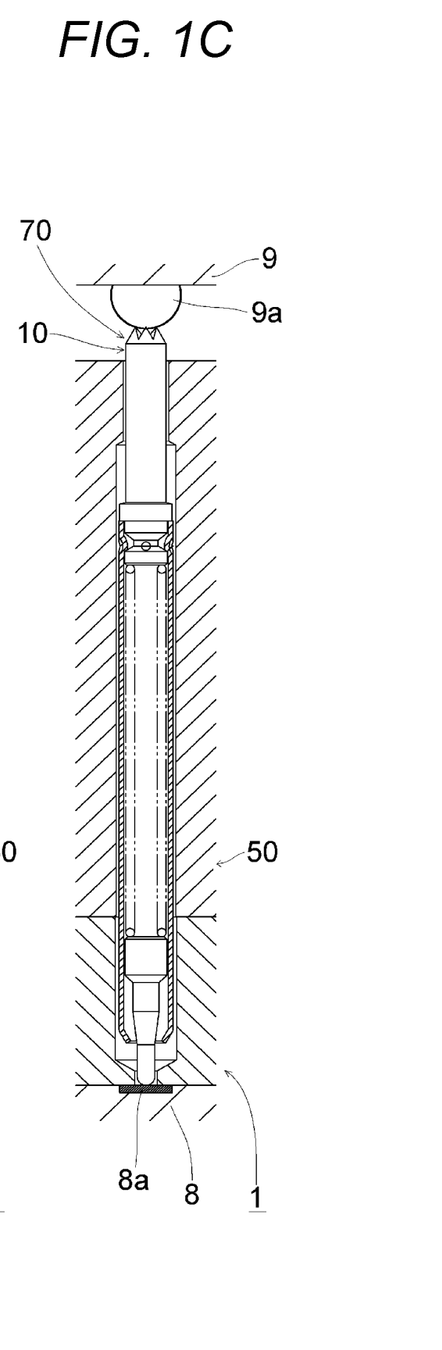
FIG. 1C is a sectional view of the socket 1 in a state where the socket 1 is mounted on the inspecting board 8, and a solder bump 9a on a device 9 to be inspected is pressed against the tip end of the first plunger 10.

The first plunger 10 has a tip end side columnar part 11, a flange part 12, and a base end side columnar part 13, in order from the tip end side. A tip end of the tip end side columnar part 11 functions as a contact part 11a, and comes into contact with a solder bump 9a on the object 9 to be inspected, at a time of inspection (FIG. 1C). The flange part 12 has a larger diameter than the tip end side columnar part 11. The flange part 12 is engaged with a step part 53a which is formed in the through hole 53 in the first insulating support body 51 of the insulating support body 50 thereby to avoid dropping the first plunger 10 from the insulating support body 50, and at the same time, restricts a projecting amount of the first plunger 10 from the insulating support body 50. Moreover, the flange part 12 is in contact with one end of the electrically conductive tube 40. The base end side columnar part 13 has a smaller diameter than the flange part 12, and is positioned inside the electrically conductive tube 40. The base end side columnar part 13 is provided with a neck part 13a in a shape of a groove making a circle in a circumferential direction. The neck part 13a is engaged with a lock part 41 of the electrically conductive tube 40 thereby to fix the first plunger 10 to the electrically conductive tube 40, and enables the electrically conductive tube 40 to move (slide) integrally with the first plunger 10, in a longitudinal direction of its own. The base end side columnar part 13 is in contact with one end of the spring 30.

The second plunger 20 has a tip end side columnar part 21, a taper part 22, an intermediate columnar part 23, and a base end side columnar part 24, in order from the tip end side. A tip end of the tip end side columnar part 21 comes into contact with an electrode 8a on the inspecting board 8, at the time of inspection (FIG. 1C). The taper part 22 is engaged with a step part 53b which is formed in the through hole 53 in the second insulating support body 52 of the insulating support body 50 thereby to restrict a projecting amount of the second plunger 20 from the insulating support body 50. The intermediate columnar part 23 has the same diameter as a base end of the taper part 22, and a smaller diameter than an inner diameter of a lock part 42 of the electrically conductive tube 40. The base end side columnar part 24 has a larger diameter than the intermediate columnar part 23, and a larger diameter than the inner diameter of the lock part 42, and is positioned inside the electrically conductive tube 40. The base end side columnar part 24 is engaged with the lock part 42 of the electrically conductive tube 40 thereby to avoid dropping the second plunger 20 from the electrically conductive tube 40. The base end side columnar part 24 is in contact with the other end of the spring 30.

One end of the spring 30 is in contact with an end face of the base end side columnar part 13 of the first plunger 10, and the other end of the spring 30 is in contact with an end face of the base end side columnar part 24 of the second plunger 20. When the spring 30 is compressed at the time of inspection, as shown in FIG. 1C, a contact force against the solder bump 9a on the object 9 to be inspected is applied to the first plunger 10, and a contact force against the electrode 8a on the inspecting board 8 is applied to the second plunger 20.

The electrically conductive tube 40 holds therein the base end side columnar part 13 of the first plunger 10 and the base end side columnar part 24 of the second plunger 20. The lock part 41 of the electrically conductive tube 40 at a side of the first plunger 10 is a part of the electrically conductive tube 40 which is collapsed inward from outside, by crimping work or so. The lock part 41 is engaged with the neck part 13a of the base end side columnar part 13 of the first plunger 10 thereby to fix the first plunger 10, and enables the electrically conductive tube 40 to move (slide) in the longitudinal direction of its own, integrally with the first plunger 10. One end of the electrically conductive tube 40 is in contact with the flange part 12 of the first plunger 10. The lock part 42 at the other end of the electrically conductive tube 40 is an open end of the electrically conductive tube 40 at a side of the second plunger which is reduced in diameter by drawing work or so, and is engaged with the base end side columnar part 24 of the second plunger 20 thereby to avoid dropping the second plunger 20. In this embodiment, the electrically conductive tube 40 can move inside the through hole 53 in the insulating support body 50 in the longitudinal direction of its own.

FIG. 1A shows a state where both the tip ends of the first plunger 10 and the second plunger 20 are released, and the electrically conductive tube 40 is at the uppermost position in the drawing, inside the through hole 53. In this embodiment, the tip end of the second plunger 20 coincides in position with a face of the insulating support body 50 at a side of the inspecting board 8, in a state as shown in FIG. 1A. Specifically, in a state where the tip end of the first plunger 10 is released (in a state where no external force is exerted on the tip end of the first plunger 10), it is possible to eliminate the projecting amount of the second plunger 20 from the insulating support body 50, without compressing the spring 30. Therefore, when the socket 1 is mounted on the inspecting board 8 as shown in FIG. 1B, the urging force of the spring 30 will not function as a force (load) of the second plunger 20 for pressing the electrode 8a on the inspecting board 8 (a preload is zero).

A product of the contact probe 70 has respective outer sizes, for example, as described below.

A total length of the contact probe 70: 4.85 mm

An outer diameter of the tip end side columnar part 11: 0.23 mm

An outer diameter of the base end side columnar part 21: 0.1 mm

An outer diameter of the electrically conductive tube 40: 0.31 mm

A length of the electrically conductive tube 40: 3.05 mm

In a case where the inspection is carried out using the socket 1, the socket 1 is mounted on the inspecting board 8, by positioning the contact probe 70 in alignment with the electrode 8a on the inspecting board 8 (FIG. 1A to FIG. 1B). Then, the object 9 to be inspected is made opposed to the socket 1 so that the contact probe 70 and the solder bump 9a on the object 9 to be inspected come into alignment with each other, and thereafter, the object 9 to be inspected is moved toward the socket 1 (FIG. 1B to FIG. 1C). As a result, the first plunger 10 is pressed with the solder bump 9a, and moved to the base end side while compressing the spring 30, thereby to bring the contact part 11a at the tip end of the first plunger 10 into elastic contact with the solder bump 9a. In this state, the inspection of the object 9 to be inspected is carried out. The state as shown in FIG. 1B is referred to as "an on-board state", and the state as shown in FIG. 1C is referred to as "an inspecting state".

Figure 2:
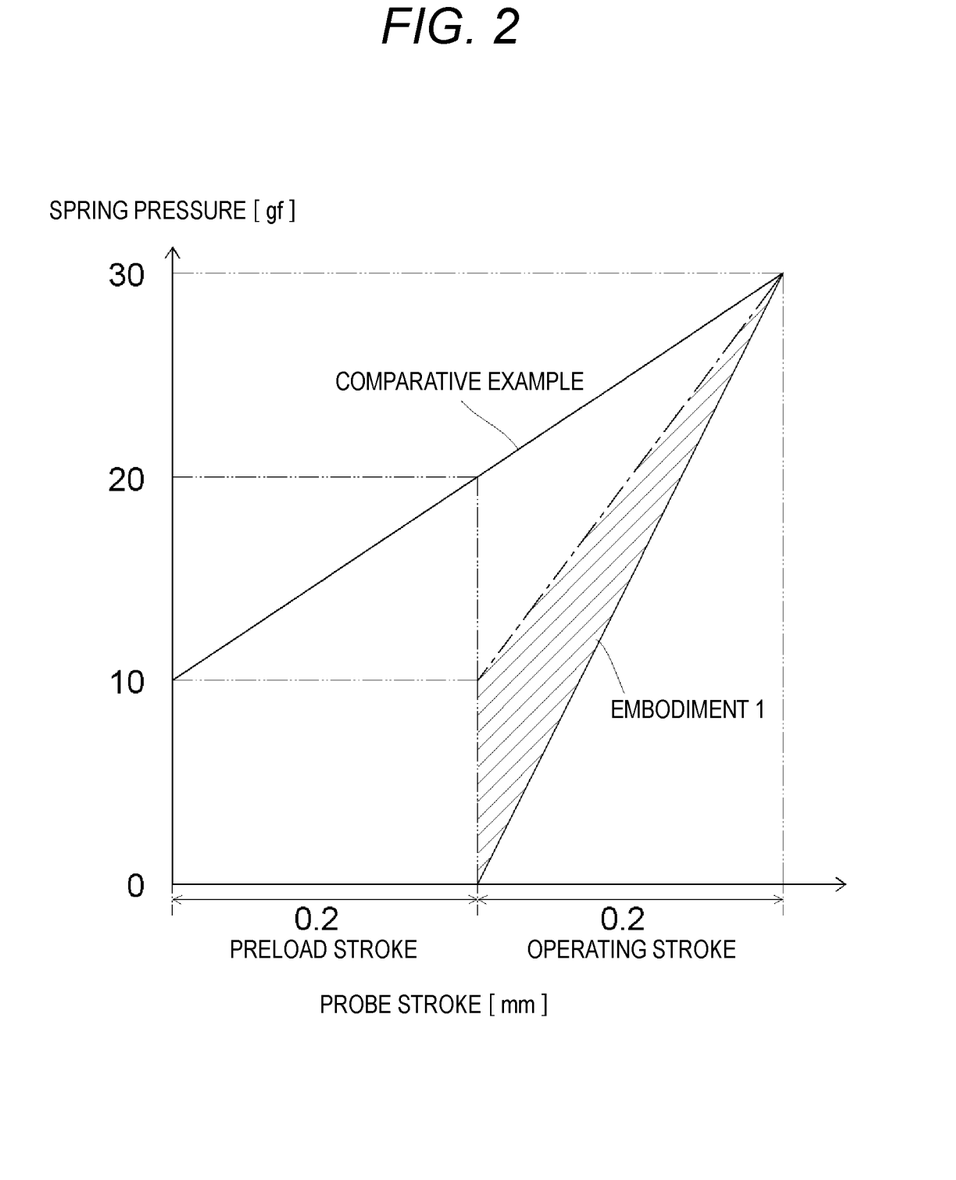
FIG. 2 is a graph showing a relation between a stroke of a contact probe 70 and an urging force (spring pressure) of a spring 30 in the socket 1, together with a relation in a comparative example.
Figure 6A:
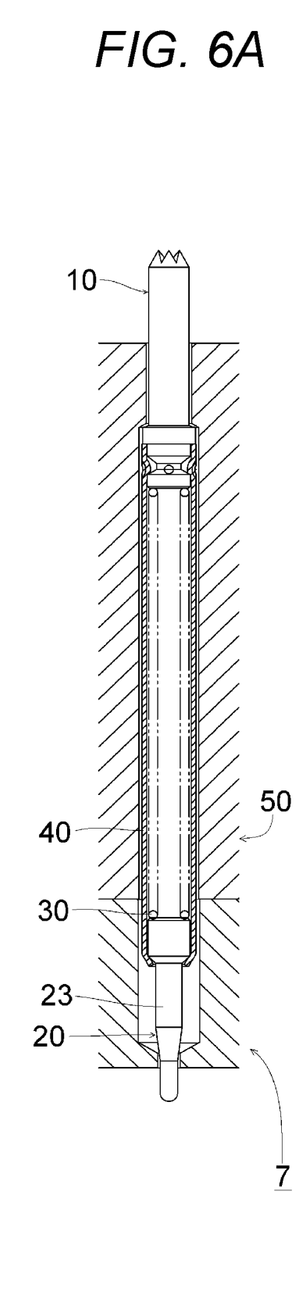
FIG. 6A is a sectional view of a socket 7 in a comparative example, in a state where both tip ends of a first plunger 10 and a second plunger 20 are released.
Figure 6B:
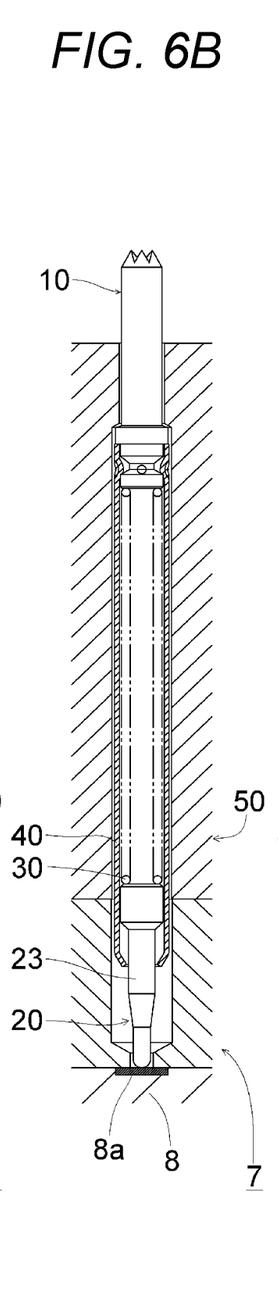
FIG. 6B is a sectional view of the socket 7 in a state where the socket 7 is mounted on the inspecting board 8, and the tip end of the first plunger 10 is released.
Figure 6C:
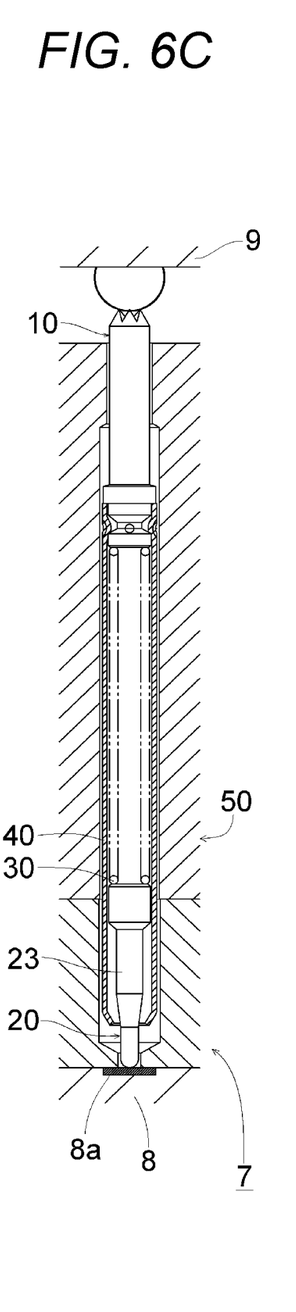
FIG. 6C is a sectional view of the socket 7 in a state where the socket 7 is mounted on the inspecting board 8, and the solder bump 9a on the device 9 to be inspected is pressed against the tip end of the first plunger 10.

FIG. 2 is a graph showing a relation between a stroke of the contact probe 70 (a probe stroke) and an urging force of the spring 30 (a spring pressure) in the socket 1, together with the relation in a comparative example. A structure of the comparative example is shown in FIGS. 6A to 6C. Respective states in FIGS. 6A to 6C correspond to those in FIGS. 1A to 1C. Specifically, FIG. 6A shows a state where both the tip ends of the first plunger 10 and the second plunger 20 are released, FIG. 6B shows a state where the socket 7 is positioned and mounted on the inspecting board 8 ("the on-board state"), and FIG. 6C shows a state where the first plunger 10 is brought into elastic contact with the object 9 to be inspected for carrying out the inspection ("the inspecting state"). The socket 7 in the comparative example is different from the socket 1 in this embodiment, in that the intermediate columnar part 23 of the second plunger 20 is longer, as compared with the socket 1 in this embodiment, the tip end of the second plunger 20 projects from the insulating support body 50, even in a state where the electrically conductive tube 40 is at the uppermost position inside the through hole 53, and further, the load characteristics of the spring 30 is different. In the other respects, the socket 7 is substantially the same as the socket 1. When the socket 7 in the comparative example is mounted on the inspecting board 8 as shown in FIG. 6B, the second plunger 20 is pressed with the electrode 8a on the inspecting board 8 thereby to move to the base end side while compressing the spring 30. Therefore, in a state where the tip end of the first plunger 10 is released, the urging force of the spring 30 functions as such a force (load) that the tip end of the second plunger 20 pushes the electrode 8a on the inspecting board 8 (there is a preload). Specifically, in the socket 7 in the comparative example, in the state where the tip ends of both the first plunger 10 and the second plunger 20 are released, as shown in FIG. 6A, the urging force of the spring 30 (the initial spring pressure) is 10 gf, as shown in FIG. 2. In the state where the socket 7 is mounted on the inspecting board 8, as shown in FIG. 6B, that is, in "the on-board state" (the spring 30 is compressed from the state in FIG. 6A by 0.2 mm), the spring force of the spring 30 (the urging force) is 20 gf, and at the time of inspection as shown in FIG. 6C, that is, in "the inspecting state" (the spring 30 is further compressed from the state as shown in FIG. 6B by 0.2 mm), spring pressure of the spring 30 is 30 gf. The spring pressure 20 gf of the spring 30 in "the on-board state" functions, as it is, as the force (load) for pushing the electrode, the so-called preload. Moreover, when the solder bump 9a on the object 9 to be inspected is first contacted with the first plunger 10 for inspection, the urging force which is exerted on the solder bump 9a is also 20 gf.

On the other hand, in the socket 1 in this embodiment, in the state where both the tip ends of the first plunger 10 and the second plunger 20 are released, as shown in FIG. 1A, the urging force of the spring 30 (the initial spring pressure) is 0 gf. In the state where the socket 1 is mounted on the inspecting board 8, as shown in FIG. 1B, that is, in "the on-board state", the urging force of the spring 30 (the spring pressure) is the same as the urging force of the spring 30 in the state as shown in FIG. 1A, and at the time of inspection as shown in FIG. 1C, that is, in "the inspecting state" (the spring 30 is further compressed from the state as shown in FIG. 1B by 0.2 mm), the spring pressure of the spring 30 is 30 gf. In "the on-board state", the spring 30 is not compressed (the preload stroke in the comparative example is not present), and therefore, the force for pushing the electrode (the load), the so-called preload is zero. A case where the initial spring pressure of the spring 30 is 0 gf is the states as shown in FIGS. 1A and 1B in which the spring 30 has a natural length. As described below, in a case where the initial spring pressure of the spring 30 is increased from 0 gf to 10 gf, the spring 30 is compressed from the natural length in the state as shown in FIGS. 1A and 1B. Moreover, when the solder bump 9a on the object 9 to be inspected is first contacted with the first plunger 10 for inspection, the urging force exerted on the solder bump 9a is 0 gf, which is the initial spring pressure of the spring 30. In this manner, the spring 30 in the comparative example has such load characteristics that the initial spring pressure before the preload stroke compression is 10 gf, the spring pressure becomes 20 gf, when the spring is compressed by 0.2 mm, that is, the preload stroke, in "the on-board state", and further, the spring pressure becomes 30 gf, when the spring is compressed by 0.2 mm, that is, the operating stroke, in "the inspecting state". In contrast, the spring 30 in the present embodiment has such load characteristics that because the preload is zero, the spring pressure is 0 gf in "the on-board state", that is, the initial spring pressure, and the spring pressure becomes 30 gf, when the spring is compressed by 0.2 mm, that is, the operating stroke, in "the inspecting state". Specifically, the spring 30 in the present embodiment has such the load characteristics that an increasing amount of the load with respect to the stroke is larger, as compared with the spring 30 in the comparative example, as apparent from FIG. 2.

Figure 3:
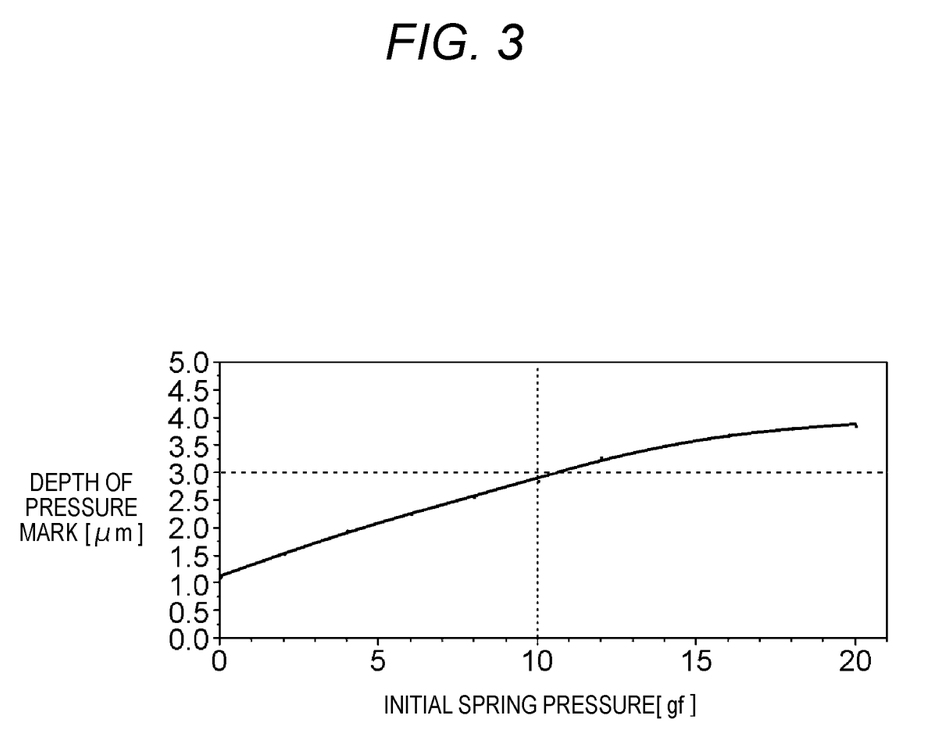
FIG. 3 is a graph showing a relation between an initial spring pressure of the spring 30 in the socket 1 and a depth of a pressure mark which is formed in an electrode 8a on the inspecting board 8.

FIG. 3 is a graph showing a relation between the initial spring pressure of the spring 30 and a depth of a pressure mark which is formed in the electrode 8a on the inspecting board 8 in the socket 1. In this embodiment, the urging force of the spring 30 does not function as the contact force (the preload) between the tip end of the second plunger 20 and the electrode 8a on the inspecting board 8, in the state as shown in FIG. 1B, as described above. For this reason, it is concerned that when the first plunger 10 is pressed with the solder bump 9a on the object 9 to be inspected thereby to compress the spring 30 during process of the inspection, an impact load attributed to the urging force of the spring 30 is generated between the tip end of the second plunger 20 and the electrode 8a on the inspecting board 8, and a damage (the pressure mark) occurs in the electrode 8a, which makes the contact performance unstable. In view of the above described concern, the inventors have analyzed a relation between the spring pressure of the spring 30 and the depth of the pressure mark which is formed in the electrode 8a, while varying the initial spring pressure of the spring 30, and obtained the results as shown in FIG. 3. The results in FIG. 3 show the depth of the pressure marks at the respective initial spring pressures of 0 gf to 20 gf, in a case where such an operation that the socket 1 is shifted from the state in FIG. 1B to the state in FIG. 1C, and thereafter, returned to the state in FIG. 1B is repeated million times. From the results in FIG. 3, it was found that in a case where the initial spring pressure is equal to or less than 10 gf (equal to or less than ⅓ of the spring pressure at the time of inspection), the depth of the pressure mark can be suppressed below 3 μm, and it is possible to restrain the depth of the pressure mark within an allowable range, even after the contacts of million times. In FIG. 2, the load characteristics of the spring 30, when the initial spring pressure is set to be 10 gf, is shown by a one-dot chain line, and an increasing amount of the load with respect to the stroke is larger, as compared with the characteristics in the comparative example, in the same manner as the case where the initial spring pressure is set to be 0 gf. As apparent from FIG. 2, in a case where the initial spring pressure is equal to or less than 10 gf, the load characteristics is within a hatched range, and the increasing amount of the load with respect to the stroke is larger as compared with the comparative example, in either of the load characteristics of the spring. In the socket 1 in this embodiment, such possibility that resistance value becomes unstable, because the preload is zero, is concerned. However, change of the resistance value in the process of the contacts of million times was analyzed, and it was found that there is neither rise of the resistance value nor deterioration of stability which become a problem in an ordinary IC inspection, as compared with the socket 7 in which the preload is applied, as shown in FIGS. 6A to 6C.

According to this embodiment, it is possible to attain the following effects.

(1) In the state where the tip end of the first plunger 10 is released, the projecting amount of the second plunger 20 from the insulating support body 50 is eliminated without compressing the spring 30. Therefore, when the socket 1 is mounted on the inspecting board 8, as shown in FIG. 1B, the urging force of the spring 30 does not function as the contact force (the preload) between the tip end of the second plunger 20 and the electrode 8a on the inspecting board 8, and it is possible to avoid warping the insulating support body 50 (a warp of the second insulating support body 52 with respect to the first insulating support body 51) due to receiving the preload. As a result, the socket is advantageous in increasing the number of the pins and in realizing downsizing, and the cost can be reduced. Specifically, because the preload is zero, the preload in the entire socket is not increased, even though the number of the pins is increased. Moreover, it is not a problem, even though the insulating support body 50 is likely to warp, since the insulating support body 50 is made thinner for downsizing. Further, there is no need to use expensive material having high rigidity as the material for the insulating support body 50 in order to avoid the warp.

(2) Rise of the resistance value and deterioration of the stability which are concerned due to the elimination of the preload are within a sufficiently allowable range in the ordinary IC inspection, and a side effect due to elimination of the preload is limited.

(3) Since the initial spring pressure is equal to or less than 10 gf, it is possible to restrain such a problem that the pressure mark formed in the electrode 8a on the inspecting board 8 is attributed to elimination of the preload from becoming, and at the same time, it is possible to minimize damage of the solder bump 9a on the object 9 to be inspected. Moreover, in a case where the preload is applied as in the comparative example which is shown in FIG. 6, the depth of the pressure mark is 2 μm. However, in this embodiment, by making the initial spring pressure is equal to or less than 3 gf, it is possible to make the depth of the pressure mark formed in the electrode 8a smaller than 2 μm.

Embodiment 2

Figure 4A:
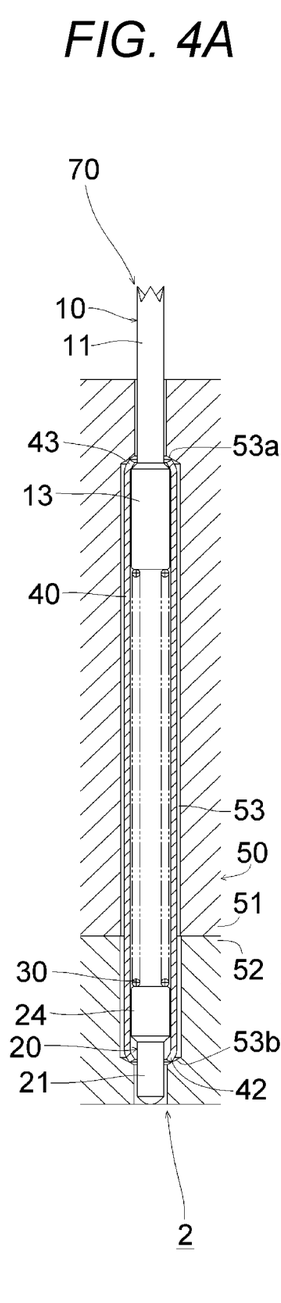
FIG. 4A is a sectional view of a socket 2 in Embodiment 2 according to the present invention, in a state where both tip ends of a first plunger 10 and a second plunger 20 are released.

FIG. 4A is a sectional view of a socket 2 in Embodiment 2 according to the present invention, in a state where both the tip ends of the first plunger 10 and the second plunger 20 are released. Embodiment 2 will be specifically described below, mainly referring to different points from Embodiment 1.

In the socket 2, the first plunger 10 is movable (slidable) in a longitudinal direction of its own with respect to the electrically conductive tube 40. By engaging the base end side columnar part 13 with a lock part 43 of the electrically conductive tube 40, drop of the first plunger 10 from the electrically conductive tube 40 is avoided, and at the same time, a projecting amount of the first plunger 10 from the insulating support body 50 is restricted. By engaging the base end side columnar part 24 with the lock part 42 of the electrically conductive tube 40, drop of the second plunger 20 from the electrically conductive tube 40 is avoided, and at the same time, a projecting amount of the second plunger 20 from the insulating support body 50 is restricted. The lock part 43 of the electrically conductive tube 40 is a part which is formed by reducing a diameter by drawing work or the like, in the same manner as the lock part 42. The lock part 43 is locked to the step part 53a of the through hole 53, and the lock part 42 is locked to the step part 53b, so that the electrically conductive tube 40 may not move in a longitudinal direction of its own, inside the through hole 53 in the insulating support body 50.

FIG. 4A shows the second plunger 20 in a state moved to the uppermost position in the drawing, inside the electrically conductive tube 40, within a range where the spring 30 is not compressed (the spring 30 has the natural length). In this state, a lower face of the insulating support body 50 (the face opposed to the inspecting board) and the tip end of the second plunger 20 coincide in position with each other. Accordingly, the preload is zero in this embodiment, in the same manner as in Embodiment 1. In this embodiment, it is the necessary condition for making the preload zero that the initial spring pressure of the spring 30 is zero. This embodiment is substantially the same as Embodiment 1 in the other points. This embodiment can also attain the same effects as Embodiment 1.

Embodiment 3

Figure 4B:
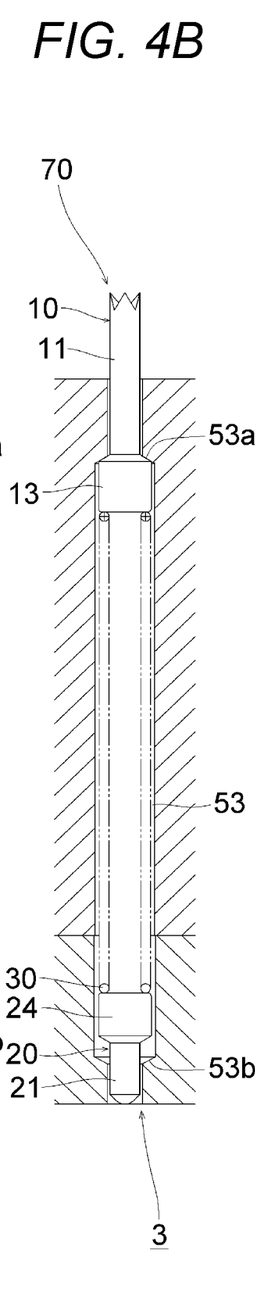
FIG. 4B is a sectional view of a socket 3 in Embodiment 3 according to the invention, in a state where both tip ends of a first plunger 10 and a second plunger 20 are released.

FIG. 4B is a sectional view of a socket 3 in Embodiment 3 according to the present invention, in a state where both the tip ends of the first plunger 10 and the second plunger 20 are released. Embodiment 2 will be specifically described below, mainly referring to different points from Embodiment 2.

In the socket 3, the contact probe 70 is of a tubeless type, and has no such a member as corresponding to the electrically conductive tube 40 in Embodiment 2. By engaging the base end side columnar part 13 with the step part 53a of the through hole 53 in the insulating support body 50, drop of the first plunger 10 from the insulating support body 50 is avoided, and at the same time, a projecting amount of the first plunger 10 from the insulating support body 50 is restricted. By engaging the base end side columnar part 24 with the step part 53b in the through hole 53, drop of the second plunger 20 from the insulating support body 50 is avoided, and at the same time, a projecting amount of the second plunger 20 from the insulating support body 50 is restricted.

FIG. 4B shows the second plunger 20 in a state moved to the uppermost position in the drawing, inside the through hole 53 in the insulating support body 50, within a range where the spring 30 is not compressed (the spring 30 has the natural length). In this state, the lower face of the insulating support body 50 (the face opposed to the inspecting board) and the tip end of the second plunger 20 coincide in position with each other. Accordingly, the preload is zero in this embodiment, in the same manner as in Embodiment 2. This embodiment is substantially the same as Embodiment 2 in the other points. This embodiment can also attain the same effects as Embodiment 2.

Embodiment 4

Figure 4C:
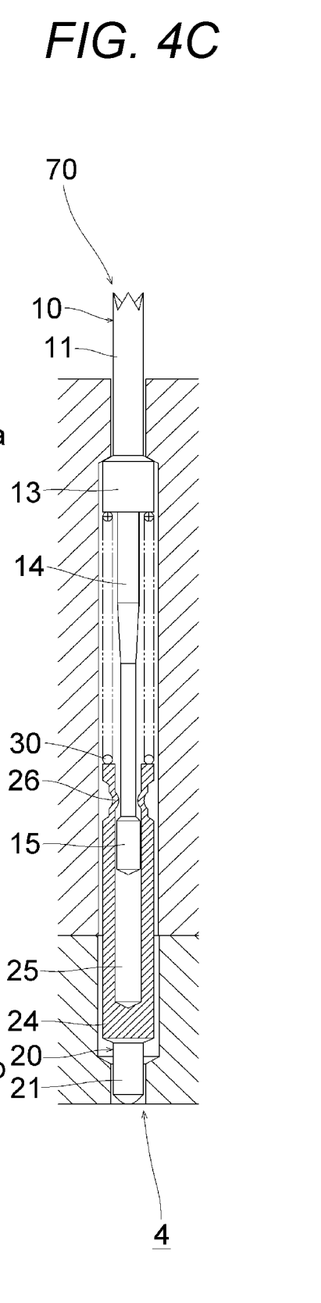
FIG. 4C is a sectional view of a socket 4 in Embodiment 4 according to the invention, in a state where both tip ends of a first plunger 10 and a second plunger 20 are released.

FIG. 4C is a sectional view of a socket 4 in Embodiment 4 according to the present invention, in a state where both the tip ends of the first plunger 10 and the second plunger 20 are released. Embodiment 4 will be specifically described below, mainly referring to different points from Embodiment 3.

In the socket 4, the first plunger 10 has a rod-shaped part 14 extending further from the base end side columnar part 13 to the base end side. A base end part of the rod-shaped part 14 is formed as a drop preventing large diameter part 15. The base end side columnar part 24 of the second plunger 20 is in a shape of a bottomed cylinder having a hole 25 which is open to the base end side. The hole 25 has a lock part 26 which is partially reduced in diameter by press work or the like. The rod-shaped part 14 of the first plunger 10 passes through the spring 30 and extends inside the hole 25 of the base end side columnar part 24 of the second plunger 20. Because of engagement between the drop preventing large diameter part 15 of the rod-shaped part 14 and the lock part 26 of the hole 25 and function of the spring 30, the first plunger 10, the second plunger 20, and the spring 30 are allowed to move together (integrally) in a vertical direction in FIG. 4C.

FIG. 4C shows the second plunger 20 in a state moved to the uppermost position in the drawing, inside the through hole. In this state, the lower face of the insulating support body 50 (the face opposed to the inspecting board) and the tip end of the second plunger 20 coincides in position with each other. Accordingly, the preload is zero in this embodiment, in the same manner as in Embodiment 3. In this embodiment, it is not the necessary condition for making the preload zero that the initial spring pressure of the spring 30 is zero. The initial spring pressure of the spring 30 is set to be equal to or less than 10 gf in the same manner as in Embodiment 1. This embodiment is substantially the same as Embodiment 3 in the other points. This embodiment can also achieve the same effects as Embodiment 3.

Embodiment 5

Figure 5A:
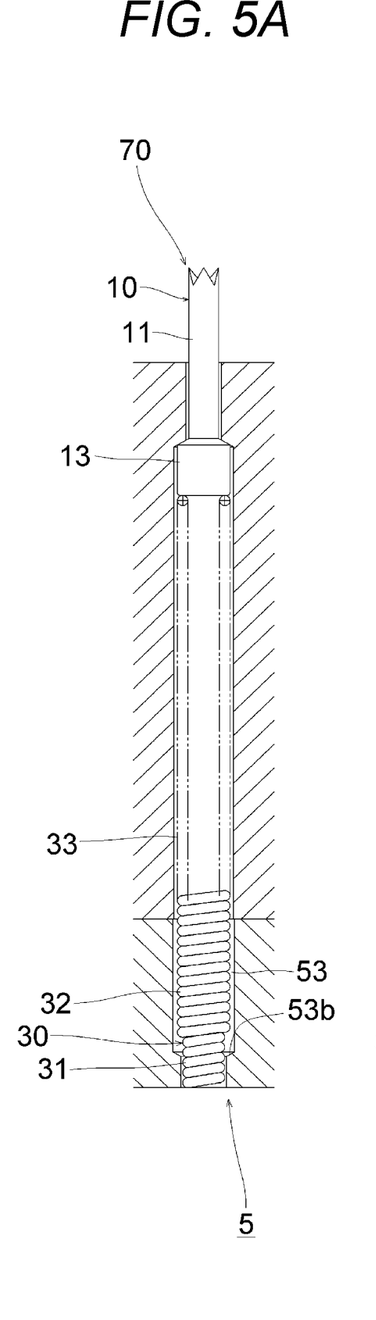
FIG. 5A is a sectional view of a socket 5 in Embodiment 5 according to the invention, in a state where both tip ends of a first plunger 10 and a spring 30 are released.

FIG. 5A is a sectional view of a socket 5 in Embodiment 5 according to the present invention, in a state where both the tip ends of the first plunger 10 and the spring 30 are released. Embodiment 5 will be specifically described below, mainly referring to different points from Embodiment 3.

In the socket 5, the contact probe 70 has no such a member as corresponding to the second plunger 20 in Embodiment 3, and has such a structure that an end of the spring 30 is adapted to come into contact with the electrode on the inspecting board. The spring 30 has a tightly coiled small diameter part 31, a tightly coiled large diameter part 32, and a roughly coiled part 33, in order from the side of the inspecting board (a lower end side). The tightly coiled small diameter part 31 and the tightly coiled large diameter part 32 are provided in order to reduce a resistance value of an entire spring 30. The roughly coiled part 33 is provided in order to secure a compressible length of the spring 30 (a stroke of the first plunger 10). By engaging the tightly coiled part 32 with the step part 53b in the through hole 53, drop of the spring 30 from the insulating support body 50 is avoided.

FIG. 5A shows the spring 30 in a state moved to the uppermost position in the drawing, inside the through hole 53 of the insulating support body 50, without being compressed (the spring 30 has the natural length). In this state, the lower face of the insulating support body 50 (the face opposed to the inspecting board) and the end of the spring 30 at the inspecting board side coincide in position with each other. Accordingly, the preload is zero in this embodiment, in the same manner as in Embodiment 3. This embodiment is substantially the same as Embodiment 3 in the other points. This embodiment can also attain the same effects as Embodiment 3.

Embodiment 6

Figure 5B:
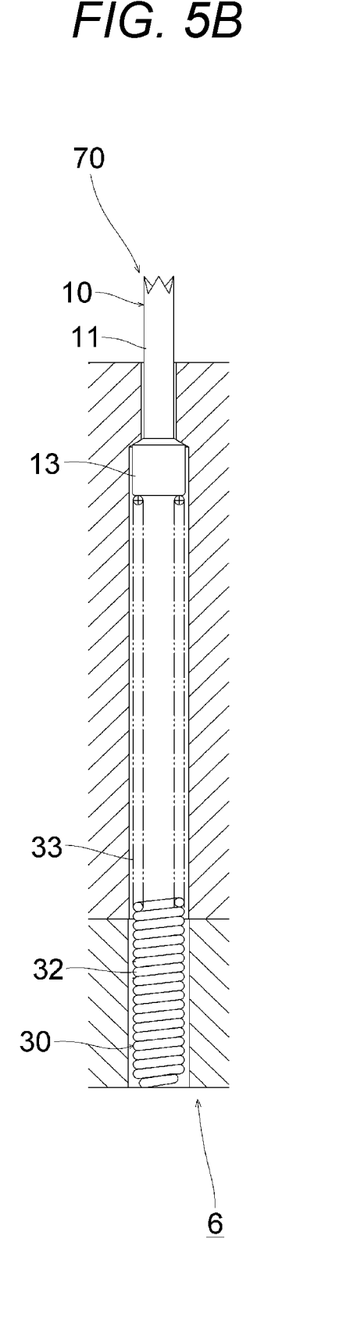
FIG. 5B is a sectional view of a socket 6 in Embodiment 6 according to the invention, in a state where both tip ends of a first plunger 10 and a spring 30 are released.

FIG. 5B is a sectional view of a socket 6 in Embodiment 6 according to the present invention, in a state where both the tip ends of the first plunger 10 and the second plunger 20 are released. Embodiment 6 will be specifically described below, mainly referring to different points from Embodiment 5.

In the socket 6, the spring 30 has no such a part as corresponding to the tightly coiled small diameter part 31 in Embodiment 5. Moreover, the step part 53b in Embodiment 5 is not provided in the through hole 53 in the insulating support body 50. Therefore, the spring 30 is not retained with respect to the insulating support body 50. However, it is not a problem that the spring 30 may drop, because the inspecting board is abutted against the lower face (the face opposed to the inspecting board) of the insulating support body 50, when the socket 6 is used. This embodiment is substantially the same as Embodiment 5 in the other points. This embodiment can also attain the same effects as Embodiment 5.

Although the present invention has been described with reference to the embodiments, as examples, it is obvious to those skilled in the art that the components and processing processes in the embodiments can be variously modified within a scope of the claims. For example, it is possible to employ the spring 30 in Embodiment 5 in place of the spring 30 and the second plunger 20 in Embodiment 1. In this case, the roughly coiled part 33 in Embodiment 5 functions as the spring 30 in Embodiment 1, and the tightly coiled small diameter part 31 and the tightly coiled large diameter part 32 in Embodiment 5 function as the base end side columnar part 24 of the second plunger 20 in Embodiment 1 and the intermediate columnar part 23 which is positioned at the tip end side from the base end side columnar part 24 and the like.

According to the invention described in the above embodiments, it is possible to provide a socket which is advantageous in increasing the number of pins and in realizing downsizing, and capable of achieving cost reduction.

What is claimed is:
1. A socket comprising:
a contact probe; and
an insulating support body supporting the contact probe and having a through hole which contains the contact probe, wherein
the contact probe includes:
  a first plunger;
  an electrically conductive tube integrally provided with the first plunger;
  a second plunger capable of being exposed through the through hole; and
  a spring configured to urge the first plunger and the second plunger in a direction apart from each other,
in a state where a tip end of the first plunger is released, the second plunger is configured not to be projected from the insulating support body, and
the second plunger includes a plurality of taper portions which are a first taper portion disposed inside the electrically conductive tube and configured to prevent the second plunger from dropping, and a second taper portion available to be disposed outside the electrically conductive tube and available to engage with an opening of the through hole to limit a projection amount of the second plunger from the insulating support body.
2. The socket according to claim 1, wherein
the spring is loaded in the contact probe, in a state where movements of the first plunger and the second plunger in the direction apart from each other are limited, without depending on the insulating support body.
3. The socket according to claim 2, wherein
the second plunger is provided inside the electrically conductive tube, in a state prevented from dropping from the electrically conductive tube, and
the spring is provided inside the electrically conductive tube.
4. The socket according to claim 1, wherein,
an urging force of the spring is equal to or less than 10 gf, in a state where the tip end of the first plunger is released and the second plunger is not projected from the insulating support body.
5. The socket according to claim 1, wherein,
an urging force of the spring is equal to or less than one third of an urging force of the spring at a time of inspection, in a state where the tip end of the first plunger is released and the second plunger is not projected from the insulating support body.
6. The socket according to claim 1, wherein
in the state where the tip end of the first plunger is released, the second plunger is restricted from projecting from the insulating support body without compressing the spring.
7. The socket according to claim 1, further comprising:
an electrically conductive tube contacting the first plunger and the second plunger, wherein
the insulating support body includes a step part restricting a projection of the electrically conductive tube.
8. The socket according to claim 1, wherein
the first plunger is connected with an object to be inspected, and
the second plunger is connected with an inspecting board.
9. The socket according to claim 1, further comprising:
an electrically conductive tube contacting the first plunger and the second plunger, wherein the first plunger includes a flange part restricting a projection of the electrically conductive tube.
10. The socket according to claim 1, wherein the second plunger is exposed through the through hole.
11. The socket according to claim 1, wherein
the second plunger further includes an intermediate columnar part, and
the intermediate columnar part is positioned between the first taper portion and the second taper portion.
12. The socket according to claim 11, wherein
the electrically conductive tube contacts the first plunger and the second plunger,
the conductive tube includes a lock part which is engaged with the first taper portion, an inner diameter of the lock part is larger than a diameter of the intermediate columnar part, and a diameter of the first taper portion is larger than the inner diameter of the lock part.

13. A socket comprising:

a contact probe; and an insulating support body supporting the contact probe and having a through hole which contains the contact probe, wherein the contact probe includes:

a first plunger;

an electrically conductive tube integrally provided with the first plunger;

a second plunger capable of being exposed through the through hole; and    a spring configured to urge the first plunger and the second plunger in a direction apart from each other, in a state where a tip end of the first plunger is released, the second plunger is configured not to be projected from the insulating support body, and the second plunger includes a first taper portion disposed inside the electrically conductive tube and a second taper portion available to be disposed outside the electrically conductive tube, a maximum diameter of the first taper portion is larger than an inner diameter of an opening of the electrically conductive tube, and a maximum diameter of the second taper portion is larger than an inner diameter of an opening of the through hole.

\* \* \* \* \*